US011119881B2

(12) United States Patent
Branson et al.

(10) Patent No.: US 11,119,881 B2
(45) Date of Patent: Sep. 14, 2021

(54) SELECTING AN OPERATOR GRAPH CONFIGURATION FOR A STREAM-BASED COMPUTING APPLICATION

(71) Applicant: International Business Machines Corporation, Armonk, NY (US)

(72) Inventors: Michael J. Branson, Rochester, MN (US); John M. Santosuosso, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1280 days.

(21) Appl. No.: 14/961,990

(22) Filed: Dec. 8, 2015

(65) Prior Publication Data
US 2016/0092247 A1    Mar. 31, 2016

Related U.S. Application Data

(63) Continuation of application No. 13/840,028, filed on Mar. 15, 2013, now Pat. No. 9,329,970.

(51) Int. Cl.
*G06F 11/34* (2006.01)
*G06F 30/33* (2020.01)
(Continued)

(52) U.S. Cl.
CPC .......... *G06F 11/3457* (2013.01); *G06F 9/455* (2013.01); *G06F 11/3404* (2013.01);
(Continued)

(58) Field of Classification Search
CPC ........................ G06F 17/30516; G06F 9/5027
See application file for complete search history.

(56) References Cited

U.S. PATENT DOCUMENTS 5,960,181 A * 9/1999 Sanadidi ............. G06F 11/3447
703/21
6,041,350 A * 3/2000 Takimoto ............ H04L 41/0233
709/223
(Continued)

OTHER PUBLICATIONS

Sakr, S., "An introduction to InfoSphere Streams—A platform for analyzing big data in motion", IBM developerWorks, Published on May 7, 2013,14 pages (Year: 2013).*
(Continued)

*Primary Examiner* — Akash Saxena
(74) *Attorney, Agent, or Firm* — James L. Olsen

(57) ABSTRACT

First and second simulated processing of a stream-based computing application using respective first and second simulation conditions may be performed. The first and second simulation conditions may specify first and second operator graph configurations. Each simulated processing may include inputting a stream of test tuples to the stream-based computing application, which may operate on one or more compute nodes. Each compute node may have one or more computer processors and a memory to store one or more processing elements. Each simulated processing may be monitored to determine one or more performance metrics. The first and second simulated processings may be sorted based on a first performance metric to identify a simulated processing having a first rank. An operator graph configuration associated with the simulated processing having the first rank may be selected if the first performance metric for the simulated processing having the first rank is within a processing constraint.

7 Claims, 9 Drawing Sheets

(51) Int. Cl.
*G06F 9/455* (2018.01)
*G06F 9/50* (2006.01)
*G06F 16/2455* (2019.01)

(52) U.S. Cl.
CPC .......... *G06F 11/3409* (2013.01); *G06F 30/33* (2020.01); *G06F 9/5027* (2013.01); *G06F 9/5083* (2013.01); *G06F 16/24568* (2019.01); *G06F 2201/865* (2013.01)

(56) References Cited

U.S. PATENT DOCUMENTS

| | | | |
|---|---|---|---|
| 7,613,848 B2 | 11/2009 | Amini et al. | |
| 7,644,110 B2 | 1/2010 | Nishizawa et al. | |
| 7,712,111 B2* | 5/2010 | Illowsky | H04L 67/1095 719/328 |
| 7,817,563 B1* | 10/2010 | Buragohain | G06F 11/3419 370/241 |
| 8,095,690 B2 | 1/2012 | Kashiyama et al. | |
| 8,117,175 B1 | 2/2012 | Johnson et al. | |
| 8,402,015 B2* | 3/2013 | Imaki | G06F 16/24542 707/713 |
| 8,560,526 B2 | 10/2013 | Santosuosso et al. | |
| 8,560,527 B2 | 10/2013 | Santosuosso et al. | |
| 8,688,646 B2* | 4/2014 | Barsness | G06F 16/24568 707/687 |
| 2005/0160103 A1 | 7/2005 | Raffo | |
| 2007/0124563 A1 | 5/2007 | Sekiyama | |
| 2007/0299980 A1* | 12/2007 | Amini | H04L 49/90 709/231 |
| 2008/0080473 A1 | 4/2008 | Thubert et al. | |
| 2009/0119553 A1 | 5/2009 | Matsushima | |
| 2009/0216585 A1* | 8/2009 | Doyle | G06Q 10/04 705/408 |
| 2009/0249295 A1* | 10/2009 | Poole | G06Q 10/06 717/120 |
| 2009/0254843 A1* | 10/2009 | Van Wie | G06F 3/04815 715/757 |
| 2009/0313614 A1* | 12/2009 | Andrade | G06F 8/451 717/151 |
| 2010/0070648 A1* | 3/2010 | Zhu | G06F 11/3414 709/235 |
| 2010/0169384 A1* | 7/2010 | Mazzagatti | G06Q 10/04 707/803 |
| 2010/0229178 A1* | 9/2010 | Ito | G06F 9/5083 718/104 |
| 2011/0106519 A1* | 5/2011 | Samper | G06F 11/3457 703/22 |
| 2012/0047505 A1 | 2/2012 | Branson et al. | |
| 2012/0218268 A1 | 8/2012 | Accola et al. | |
| 2014/0278337 A1 | 9/2014 | Branson et al. | |
| 2014/0280895 A1 | 9/2014 | Branson et al. | |
| 2015/0199214 A1* | 7/2015 | Lee | G06F 9/505 718/102 |

OTHER PUBLICATIONS

Ballard et al., "IBM InfoSphere Streams: Harnessing Data in Motion", Sep. 2010. 360 pages, IBM Redbooks. http://www.redbooks.ibm.com/abstracts/sg247865.html.

Wolf et al., "Soda: An Optimizing Scheduler for Large-Scale Stream-Based Distributed Computer Systems", V. Issarny and R. Schantz (Eds): Middleware 2008, LNCS 5346, pp. 306-325, 2008. © IFIP International Federation for Information Processing 2008.

Karn et al., "Using IBM InfoSphere Streams for simulations", IBM developerWorks, Jul. 5, 2012, 5 pages.

* cited by examiner

SELECTING AN OPERATOR GRAPH CONFIGURATION FOR A STREAM-BASED COMPUTING APPLICATION

FIELD

This disclosure generally relates to stream computing, and in particular, to computing applications that receive streaming data and process the data as it is received.

BACKGROUND

Database systems are typically configured to separate the process of storing data from accessing, manipulating, or using data stored in a database. More specifically, database systems use a model in which data is first stored and indexed in a memory before subsequent querying and analysis. In general, database systems may not be well suited for performing real-time processing and analyzing streaming data. In particular, database systems may be unable to store, index, and analyze large amounts of streaming data efficiently or in real time.

SUMMARY

Embodiments are directed to a method, system, and computer program product for selecting an operator graph configuration for a stream-based computing application. One embodiment is directed to a method that includes performing a first simulated processing of the stream-based computing application using a first simulation condition and performing a second simulated processing of the stream-based computing application using a second simulation condition. The first simulation condition specifies a first operator graph configuration. The second simulation condition specifies a second operator graph configuration and the second simulation condition may be distinct from the first simulation condition. Each simulated processing may include inputting a stream of test tuples to the stream-based computing application. The stream-based computing application may operate on one or more compute nodes. Each compute node may have one or more computer processors and a memory to store one or more processing elements. Each processing element may have one or more stream operators. The method may include monitoring each simulated processing to determine one or more performance metrics. In addition, the method may include sorting the first and second simulated processings based on a first performance metric to identify a simulated processing having a first rank. Further, the method may include selecting an operator graph configuration associated with the simulated processing having the first rank if the first performance metric for the simulated processing having the first rank is within a processing constraint.

In one embodiment, the performance metrics may include a processing time and the processing constraint may include a processing time constraint. In one embodiment, the method may include performing a third simulated processing of the stream-based computing application using a third simulation condition if the first performance metric for the simulated processing having the first rank is outside of the processing constraint. The third simulation condition may specify a third operator graph configuration and may be distinct from the first and second simulation conditions.

BRIEF DESCRIPTION OF THE DRAWINGS

Like reference numbers and designations in the various drawings indicate like elements.

DETAILED DESCRIPTION

Figure 1:
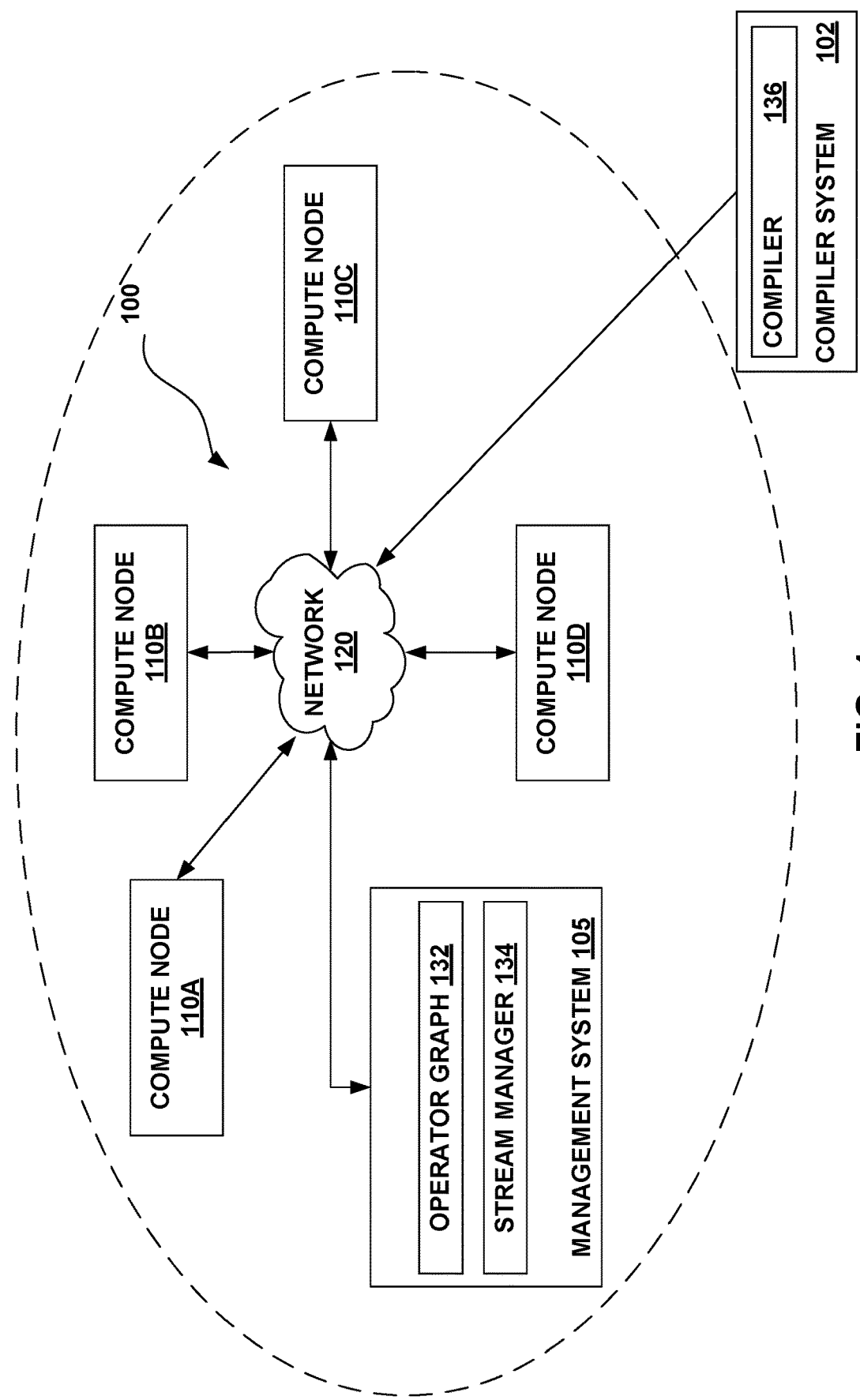
FIG. 1 illustrates a computing infrastructure configured to execute a stream-based computing application according to various embodiments.

Stream-based computing and stream-based database computing are emerging as a developing technology for database systems. Products are available which allow users to create applications that process and query streaming data before it reaches a database file. With this emerging technology, users can specify processing logic to apply to inbound data records while they are "in flight," with the results available in a very short amount of time, often in fractions of a second. Constructing an application using this type of processing has opened up a new programming paradigm that will allow for development of a broad variety of innovative applications, systems, and processes, as well as present new challenges for application programmers and database developers.

In a stream-based computing application, stream operators are connected to one another such that data flows from one stream operator to the next (e.g., over a TCP/IP socket, in-memory database, or shared memory). Scalability is achieved by distributing an application across nodes by creating executables (i.e., processing elements), as well as replicating processing elements on multiple nodes and load balancing among them. Stream operators in a stream computing application can be fused together and placed in a processing element that is executable. Fusing stream operators in a processing element allows them to share a common process space, that generally results in faster communication between stream operators than is available using inter-process communication techniques (e.g., using a TCP/IP socket). Further, processing elements can be inserted or removed dynamically from an operator graph representing the flow of data through the stream computing application.

A "tuple" is data. More specifically, a tuple is a sequence of one or more attributes associated with an entity. Attributes may be any of a variety of different types, e.g., integer, float, Boolean, string, etc. The attributes may be ordered. A tuple may be extended by adding one or more additional attributes to it. In addition to attributes associated with an entity, a tuple may include metadata, i.e., data about the tuple. As used herein, "stream" or "data stream" refers to a sequence of tuples. Generally, a stream may be considered a pseudo-infinite sequence of tuples.

Stream computing applications handle massive volumes of data that need to be processed efficiently and in real time. For example, a stream computing application may continuously ingest and analyze hundreds of thousands of messages per second and up to petabytes of data per day. Accordingly, each stream operator in a stream computing application may be required to process a received tuple within fractions of a second.

In stream-based computing applications, the stream operators and processing elements of an operator graph may be distributed across multiple compute nodes as well as within individual compute nodes. Stream operators and processing elements may be connected by inter-stream operator communication paths. An "inter-stream operator communication path," as used herein, may refer to operations that employ a shared memory segment, a pipe, a named pipe (also known as a FIFO), a message queue, a memory mapped file, an in-memory database, a UNIX domain or inter-process communication socket, or any other similar operation. An inter-stream operator communication path, as used herein, may also refer to operations that use a network and employ an internet socket, such as a TCP/IP socket, a stream socket, a datagram socket, or any other similar operation.

The stream operators and processing elements within a compute node may be connected by inter-stream operator communication paths, such as operations that employ a shared memory segment, a pipe, a named pipe, a message queue, a memory mapped file, a UNIX domain or inter-process communication socket, or any other similar operation. Processing elements on distinct compute nodes may be connected by a network having one or more links and communication operations that employ an inter-network or internet socket, such as a TCP/IP socket, a stream socket, or a datagram socket, or any other similar operation.

Whether a stream computing application will perform successfully may depend on whether the network is capable of handling the workload and whether the inter-stream operator communication paths within the compute nodes are capable of handling the workload. Accordingly, determining whether the network and the inter-stream operator communication paths within compute nodes are capable of handling a variety of workloads before the stream-based computing application is used in a live production environment may be beneficial.

According to various embodiments, an operator graph may be deployed on a network, stream operators may be configured to simulate processing, one or more simulation conditions may be specified, and a particular workload may be input to the operator graph. While simulated processing of a stream of test tuples is performed, one or more inter-stream operator communication paths (either on the network, within compute nodes, or both) may be monitored to determine one or more performance metrics. Simulated processing may include simulating different workloads, as well as shutting down or turning on parts of the operator graph. In addition, simulated processing may also include simulating activities initiated by a stream operator that may affect the network.

One example of a performance metric is the latency on a link between compute nodes. Where the latency of a link is such that the capacity of the entire streaming application is limited, a bottleneck may be identified. Other examples of a performance metric are the time required by a compute node for processing a tuple and the latency of an inter-stream operator communication path within a compute node. An additional example of a performance metric is an identification of a topographic feature of an operator graph that affects the performance of a stream-based computing application. Furthermore, while embodiments include identifying bottlenecks and other types of latency, in other embodiments, performance metrics may be used to identify locations in the operator graph with excess bandwidth, excess processing capacity, that are uncongested, or that have relatively low latency.

According to various embodiments, the performance of the stream-based computing application during the simulated processing may be monitored to determine one or more performance metrics with respect to how an inter-stream operator communication path, compute node, or other resource affects application performance. In addition the simulated processing may be monitored to determine a performance metric that identifies locations in the operator graph with excess bandwidth, excess processing capacity, that are uncongested, or that have relatively low latency.

Simulated processing may include simulating processing using a first simulation condition and then repeating the simulation using a different simulation condition with a different value for a parameter, according to various embodiments. In other words, a baseline simulation may be performed and one or more additional simulations may be performed for comparison with the baseline simulation. Generally, parameters that may be varied in multiple simulations may relate to either work load placed on the operator graph or to aspects of the operator graph itself. In the former category, one example of a parameter that may be varied in multiple simulations is the rate at which test tuples are supplied to a stream-based application, e.g., at first, second, and third rates, where the input rates may be relatively low, average, and relatively high rates, respectively. Another example of a parameter that may be varied in multiple simulations is the size (e.g., number of bytes) of test tuples supplied to a stream-based application, e.g., in first, second, and third sizes, where the sizes may be relatively small, average, and relatively large sizes, respectively. Yet another example of parameters that may be varied in multiple simulations are the attributes of test tuples supplied to a stream-based application, e.g., in first, second, and third attribute configurations, where the attribute configurations may require relatively small, average, and relatively large processing times by a stream operator, respectively. A further example of a parameter that may be varied in multiple simulations is a quantity of other, i.e., non-tuple, traffic on a network coupling compute nodes. For example, the quantity of "other traffic" on a network shared by a streaming application with another application may be nil, moderate, or heavy.

Parameters that may be varied in multiple simulations may also relate to the operator graph rather than the workload. One example of a parameter of this type that may be varied in multiple simulations is the operator graph configuration, i.e., parts of the operator graph may be turned off or turned on. For example, a stream operator, a processing element, a compute node, or a branch of an operator graph may be turned on in a baseline simulation and turned off in a subsequent simulation. An additional example of a parameter that may be varied in multiple simulations is configuring a stream operator or processing element to perform or not perform operations that may affect the network. For example, a processing element may be configured to open a TCP/IP socket and initiate a non-tuple communication. Further examples of parameters that may be varied in multiple simulations are stream operator behaviors that affect the performance of a stream-based computing application. This type of behavior may include tuple sorting and routing criteria used by a stream operator as well as the number of tuples that are output by a stream operator in response to receiving an input tuple. In addition, this type of behavior may include the size (e.g., number of bytes) of tuples output by a stream operator.

Two or more simulations may be performed in which a particular parameter is varied while all other parameters are held constant, in various embodiments. Each time simulated processing is repeated using a different value of the particular parameter, the stream-based computing application may be monitored to determine one or more performance metrics. Accordingly, each iteration of simulated processing yields performance metrics. The performance metrics may be compared to a threshold or other reference to determine if a particular parameter results in acceptable or unacceptable performance. For example, assume the parameter that is varied is the rate at which test tuples are supplied to a stream-based application. A metric value for a parameter value corresponding with a relatively low rate may indicate acceptable performance, while the metric value for a parameter value corresponding with a relatively high rate may indicate unacceptable performance.

Simulations may be performed in which first and second parameters are varied while all remaining parameters are held constant, according to various embodiments. In first simulations, two or more simulations may be performed in which the first parameter is varied while all remaining parameters are held constant. In the first simulations, the second parameter is set to an initial value and held at that value for all of the simulations. In second simulations, two or more simulations may be performed in which the second parameter is set to a second value and the first parameter is varied while all remaining parameters are held constant. As an example, first simulations may be performed in which the rate at which test tuples are supplied to a stream-based application is varied. In the first simulations, all branches of an operator graph may be active or on, while all remaining parameters are held constant. Thereafter, second simulations may be performed in which a branch of the operator graph is turned off and the rate at which test tuples are supplied to a stream-based application is varied. In the second simulations, all remaining parameters are held constant.

Various embodiments are directed to performing a first simulated processing of the stream-based computing application using a first simulation condition and performing a second simulated processing of the stream-based computing application using a second simulation condition. The first simulation condition specifies a first operator graph configuration. The second simulation condition specifies a second operator graph configuration and the second simulation condition may be distinct from the first simulation condition. Each simulated processing is monitored to determine one or more performance metrics. In addition, the first and second simulated processings may be sorted based on a first performance metric to identify a simulated processing having a first rank. An operator graph configuration associated with the simulated processing having the first rank may be selected if the first performance metric for the simulated processing having the first rank is within a processing constraint.

FIG. 1 illustrates one exemplary computing infrastructure 100 that may be configured to execute a stream-based computing application, according to some embodiments. The computing infrastructure 100 includes a management system 105 and two or more compute nodes 110A-110D—i.e., hosts—which are communicatively coupled to each other using one or more communications networks 120. A compiler system 102 may be communicatively coupled with the management system 105 and the compute nodes 110 either directly or via the communications network 120.

The one or more communications networks 120 may include one or more servers, networks, or databases, and may use a particular communication protocol to transfer data between the compute nodes 110A-110D. The communications network 120 may include a variety of types of physical communication channels or "links." The links may be wired, wireless, optical, or any other suitable media. In addition, the communications network 120 may include a variety of network hardware and software for performing routing, switching, and other functions, such as routers, switches, or bridges. The communications network 120 may be dedicated for use by a streaming application or shared with other applications and users. The communications network 120 may be any size. For example, the communications network 120 may include a single local area network or a wide area network spanning a large geographical area, such as the Internet. The links may provide different levels of bandwidth or capacity to transfer data at a particular rate. The bandwidth that a particular link provides may vary depending on a variety of factors, including the type of communication media and whether particular network hardware or software is functioning correctly or at full capacity. In addition, the bandwidth that a particular link provides to a streaming application may vary if the link is shared with other applications and users. The available bandwidth may vary depending on the load placed on the link by the other applications and users. The bandwidth that a particular link provides may also vary depending on a temporal factor, such as time of day, day of week, day of month, or season.

Figure 2:
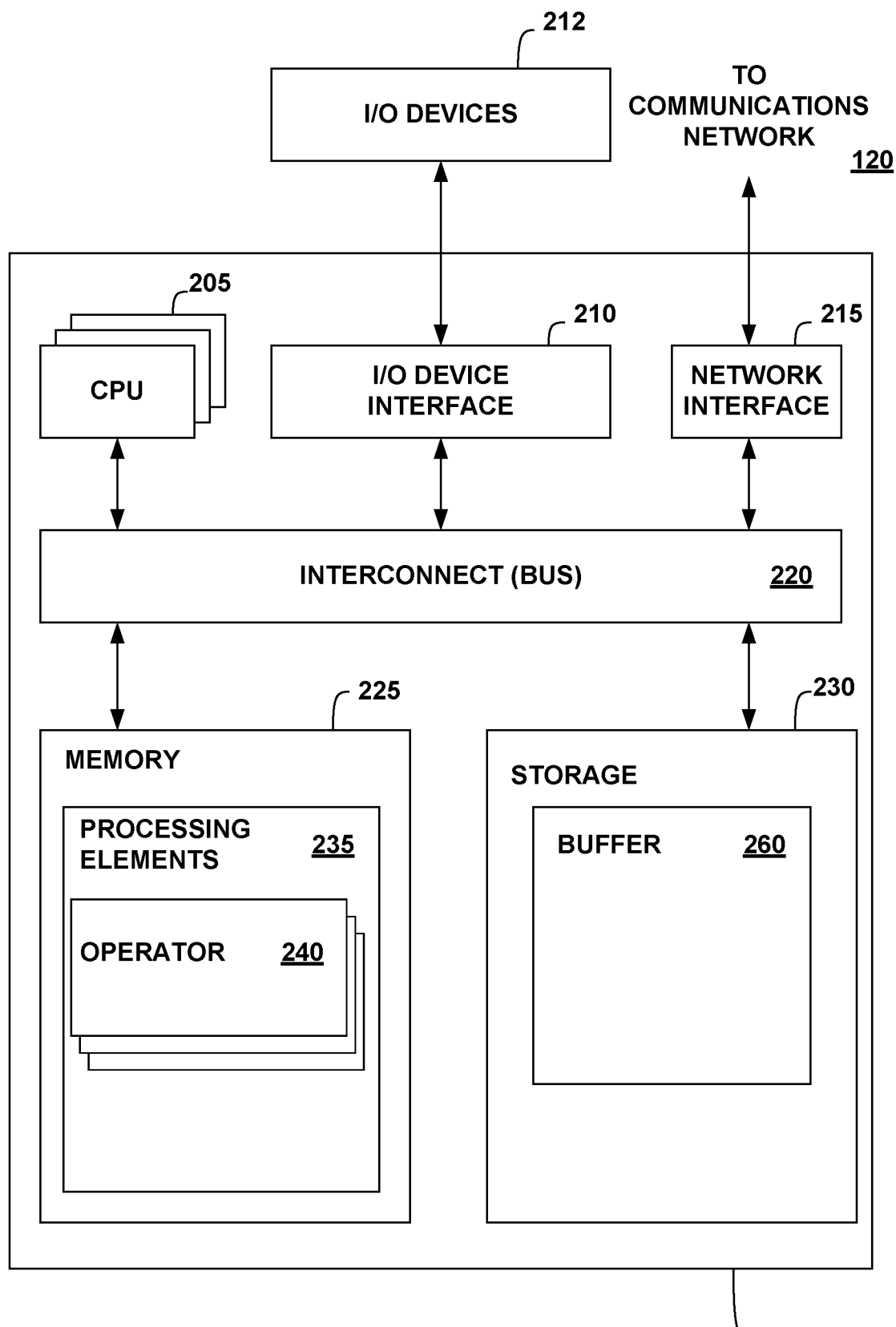
FIG. 2 illustrates a more detailed view of a compute node of FIG. 1 according to various embodiments.

FIG. 2 is a more detailed view of a compute node 110, which may be the same as one of the compute nodes 110A-110D of FIG. 1, according to various embodiments. The compute node 110 may include, without limitation, one or more processors (CPUs) 205, a network interface 215, an interconnect 220, a memory 225, and a storage 230. The compute node 110 may also include an I/O device interface 210 used to connect I/O devices 212, e.g., keyboard, display, and mouse devices, to the compute node 110.

Each CPU 205 retrieves and executes programming instructions stored in the memory 225 or storage 230. Similarly, the CPU 205 stores and retrieves application data residing in the memory 225. The interconnect 220 is used to transmit programming instructions and application data between each CPU 205, I/O device interface 210, storage 230, network interface 215, and memory 225. The interconnect 220 may be one or more busses. Alternatively, the interconnect 220 may be a crossbar switch, a banyan switch, an omega switch, or other switching fabric in various embodiments. The CPUs 205 may be a single CPU, multiple CPUs, or a single CPU having multiple processing cores in various embodiments. In one embodiment, a processor 205 may be a digital signal processor (DSP). One or more processing elements 235 (described below) may be stored in the memory 225. A processing element 235 may include one or more stream operators 240 (described below). In one embodiment, a processing element 235 is assigned to be executed by only one CPU 205, although in other embodiments the stream operators 240 of a processing element 235 may include one or more threads that are executed on two or more CPUs 205. The memory 225 is generally included to be representative of a random access memory, e.g., Static Random Access Memory (SRAM), Dynamic Random Access Memory (DRAM), or Flash. The storage 230 is generally included to be representative of a non-volatile memory, such as a hard disk drive, solid state device (SSD), or removable memory cards, optical storage, flash memory devices, network attached storage (NAS), or connections to storage area network (SAN) devices, or other devices that may store non-volatile data. The network interface 215 is configured to transmit data via the communications network 120.

A streams application may include one or more stream operators 240 that may be compiled into a "processing element" container 235. The memory 225 may include one or more processing elements 235, each processing element having one or more stream operators 240. Each stream operator 240 may include a portion of code that processes tuples flowing into a processing element and outputs tuples to other stream operators 240 in the same processing element, in other processing elements, or in both the same and other processing elements. Processing elements 235 may pass tuples to other processing elements that are on the same compute node 110 or on other compute nodes that are accessible via communications network 120. For example, a processing element on compute node 110A may output tuples to a processing element on compute node 110B via the network 120. As additional examples, a first processing element on compute node 110A may output tuples to a second processing element also on compute node 110A via a shared memory segment in the memory 225 or interconnect 220. In addition, each stream operator 240 may include operator metadata. Operator metadata may configure, customize, or specify options for a stream operator.

The storage 230 may include a buffer 260. Although shown as being in storage, the buffer 260 may be located in the memory 225 of the compute node 110 or in a combination of both memories. Moreover, storage 230 may include storage space that is external to the compute node 110, such as in a cloud.

Tuples may arrive at a processing element or stream operator faster than processing can be performed. In this case, arriving tuples may be temporarily stored in an input queue, such as in buffer 260, until the processing element or stream operator is available to process the buffered tuples. Similarly, output tuples may be produced by a processing element or stream operator faster than they can be transmitted via an inter-stream operator communication path, such as a link. In this case, output tuples may be temporarily stored in an output queue, such as in buffer 260, until the inter-stream operator communication path is available to transmit the buffered tuples.

Figure 3:
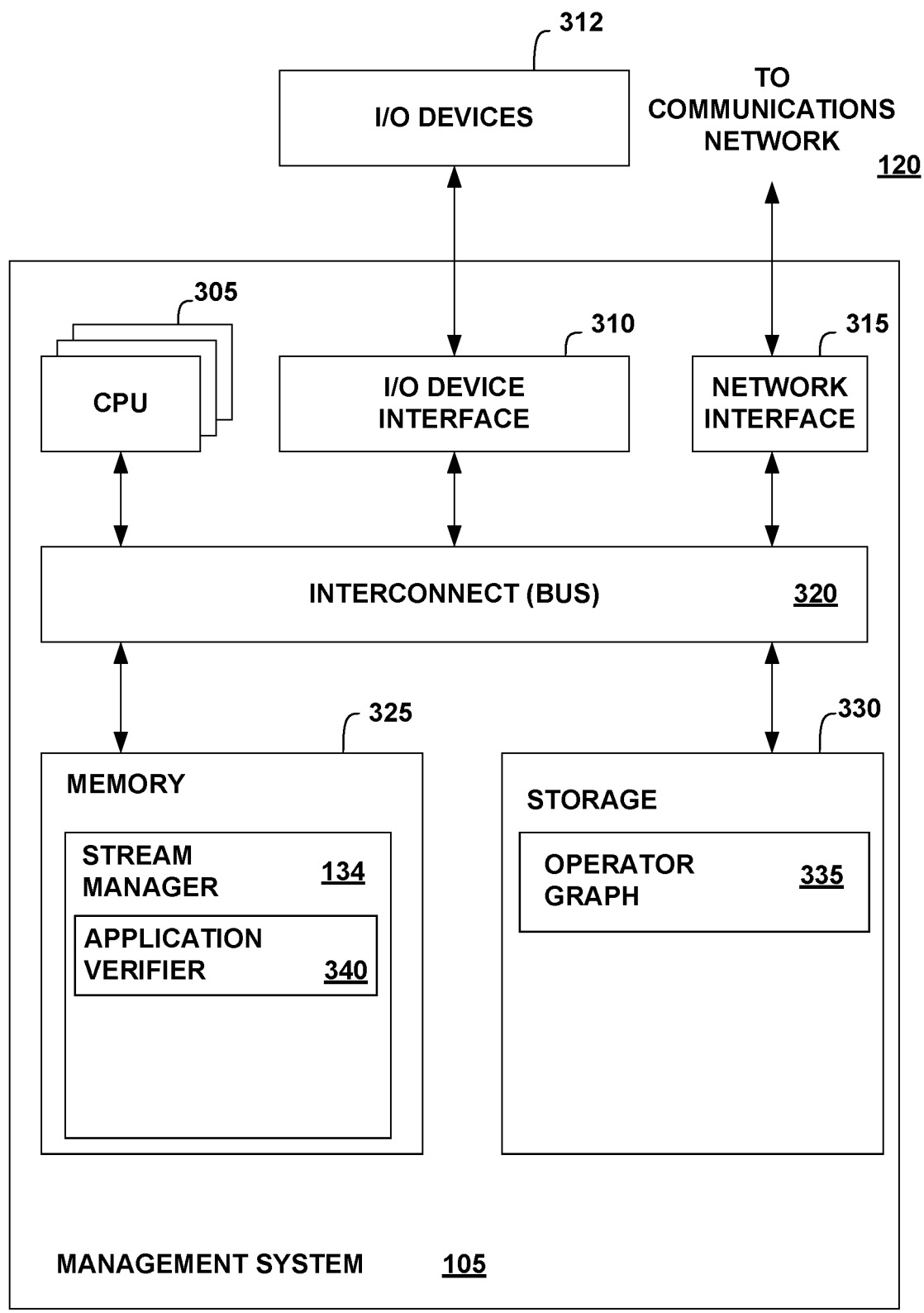
FIG. 3 illustrates a more detailed view of the management system of FIG. 1 according to various embodiments.

FIG. 3 is a more detailed view of the management system 105 of FIG. 1 according to some embodiments. The management system 105 may include, without limitation, one or more processors (CPUs) 305, a network interface 315, an interconnect 320, a memory 325, and a storage 330. The management system 105 may also include an I/O device interface 310 connecting I/O devices 312, e.g., keyboard, display, and mouse devices, to the management system 105.

Each CPU 305 retrieves and executes programming instructions stored in the memory 325 or storage 330. Similarly, each CPU 305 stores and retrieves application data residing in the memory 325 or storage 330. The interconnect 320 is used to move data, such as programming instructions and application data, between the CPU 305, I/O device interface 310, storage unit 330, network interface 305, and memory 325. The interconnect 320 may be one or more busses. The CPUs 305 may be a single CPU, multiple CPUs, or a single CPU having multiple processing cores in various embodiments. In one embodiment, a processor 305 may be a DSP. Memory 325 is generally included to be representative of a random access memory, e.g., SRAM, DRAM, or Flash. The storage 330 is generally included to be representative of a non-volatile memory, such as a hard disk drive, solid state device (SSD), removable memory cards, optical storage, flash memory devices, network attached storage (NAS), connections to storage area-network (SAN) devices, or the cloud. The network interface 315 is configured to transmit data via the communications network 120.

The memory 325 may store a stream manager 134. Additionally, the storage 330 may store an operator graph 335. The operator graph 335 may define how tuples are routed to processing elements 235 (FIG. 2) for processing. In addition, the stream manager 134 may store an application verifier 340. The application verifier 340 may examine the operator graph 335 to determine where one or more bottlenecks may occur and under what conditions a bottleneck may occur. A bottleneck may be a location that limits the capacity of an entire streaming application. A bottleneck may occur on inter-stream operator communication path. A bottleneck may occur on a single link or in a region (two or more links) of the operator graph 132. A bottleneck may occur within a compute node, such as a bottleneck that occurs in connection with use of shared memory. A bottleneck may be in a location where available bandwidth is substantially slower than other similar locations, e.g., other similar links or regions of the operator graph 132. In addition, a bottleneck may be a link, region, or other location where the volume of data being transferred is substantially greater than the volume of data transferred on other similar links, regions, or locations. Further, the application verifier 340 may identify topographic features that affect the performance of a stream-based computing application. The application verifier 340 may help a user understand whether the infrastructure of a particular network is capable of handling a particular workload within a required time period. The application verifier 340 may help a user understand how to eliminate network problems, such as congestion and bottle necks, up front before a streaming application is deployed in a production environment.

Figure 4:
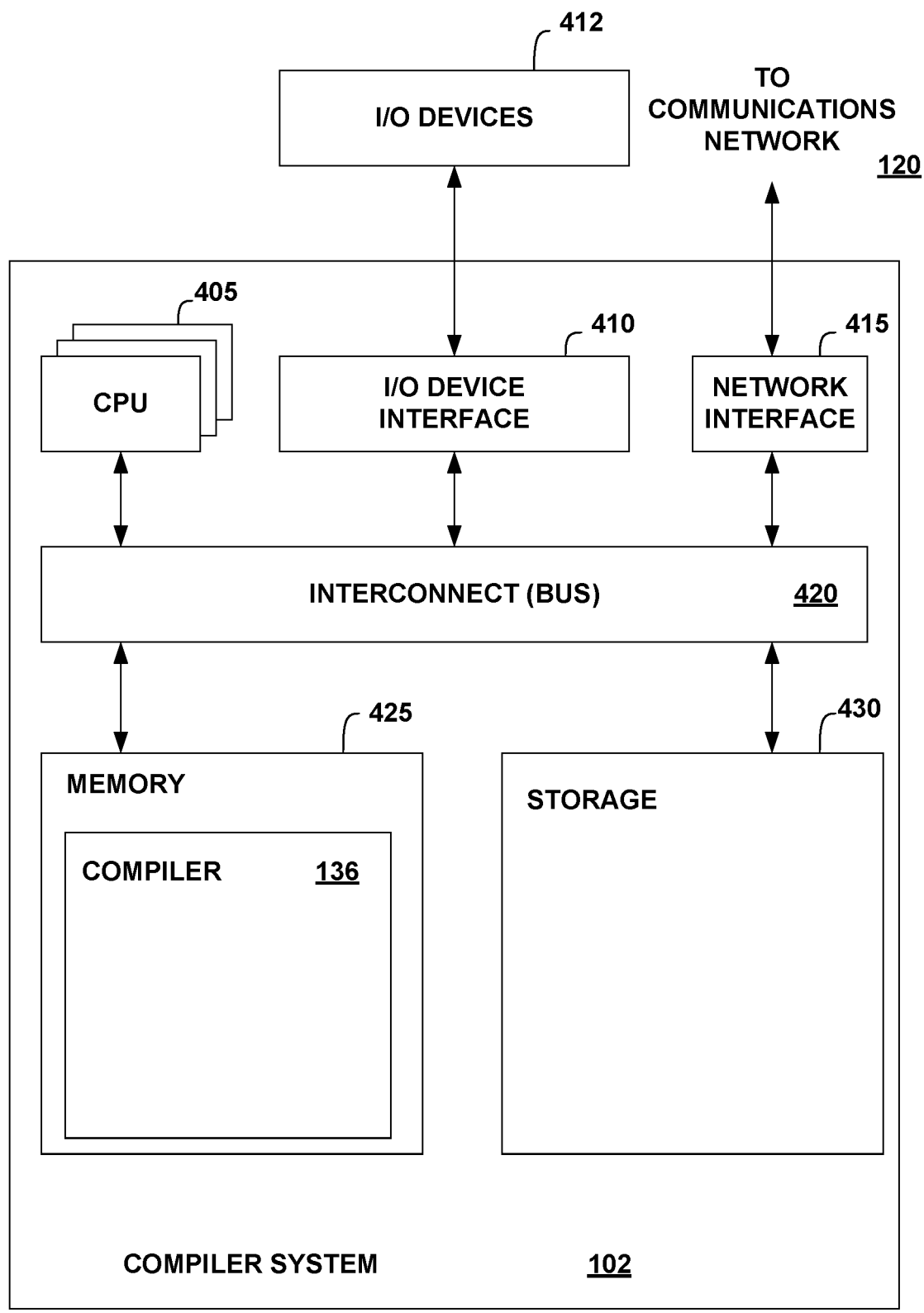
FIG. 4 illustrates a more detailed view of the compiler system of FIG. 1 according to various embodiments.

FIG. 4 is a more detailed view of the compiler system 102 of FIG. 1 according to some embodiments. The compiler system 102 may include, without limitation, one or more processors (CPUs) 405, a network interface 415, an interconnect 420, a memory 425, and storage 430. The compiler system 102 may also include an I/O device interface 410 connecting I/O devices 412, e.g., keyboard, display, and mouse devices, to the compiler system 102.

Each CPU 405 retrieves and executes programming instructions stored in the memory 425 or storage 430. Similarly, each CPU 405 stores and retrieves application data residing in the memory 425 or storage 430. The interconnect 420 is used to move data, such as programming instructions and application data, between the CPU 405, I/O device interface 410, storage unit 430, network interface 415, and memory 425. The interconnect 420 may be one or more busses. The CPUs 405 may be a single CPU, multiple CPUs, or a single CPU having multiple processing cores in various embodiments. In one embodiment, a processor 405 may be a DSP. Memory 425 is generally included to be representative of a random access memory, e.g., SRAM, DRAM, or Flash. The storage 430 is generally included to be representative of a non-volatile memory, such as a hard disk drive, solid state device (SSD), removable memory cards, optical storage, flash memory devices, network attached storage (NAS), connections to storage area-network (SAN) devices, or to the cloud. The network interface 415 is configured to transmit data via the communications network 120.

The memory 425 may store a compiler 136. The compiler 136 compiles modules, which include source code or statements, into the object code, which includes machine instructions that execute on a processor. In one embodiment, the compiler 136 may translate the modules into an intermediate form before translating the intermediate form into object code. The compiler 136 may output a set of deployable artifacts that may include a set of processing elements and an application description language file (ADL file), which is a configuration file that describes the streaming application. In some embodiments, the compiler 136 may be a just-in-time compiler that executes as part of an interpreter. In other embodiments, the compiler 136 may be an optimizing compiler. In various embodiments, the compiler 136 may perform peephole optimizations, local optimizations, loop optimizations, inter-procedural or whole-program optimizations, machine code optimizations, or any other optimizations that reduce the amount of time required to execute the object code, to reduce the amount of memory required to execute the object code, or both.

The compiler 136 may also provide the application administrator with the ability to optimize performance through profile-driven fusion optimization. Fusing operators may improve performance by reducing the number of calls to a transport. While fusing stream operators may provide faster communication between operators than is available using inter-process communication techniques, any decision to fuse operators requires balancing the benefits of distributing processing across multiple compute nodes with the benefit of faster inter-operator communications. The compiler 136 may automate the fusion process to determine how to best fuse the operators to be hosted by one or more processing elements, while respecting user-specified constraints. This may be a two-step process, including compiling the application in a profiling mode and running the application, then re-compiling and using the optimizer during this subsequent compilation. The end result may, however, be a compiler-supplied deployable application with an optimized application configuration.

Figure 5:
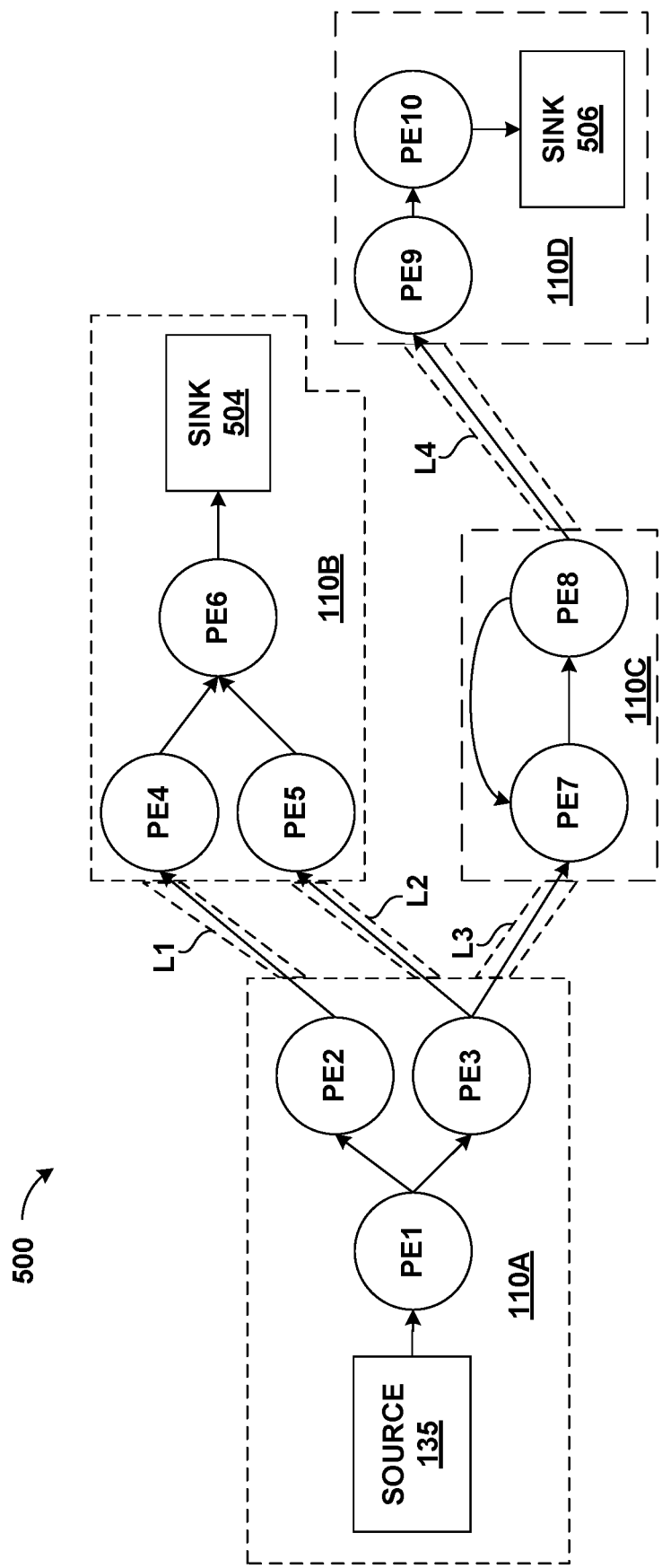
FIG. 5 illustrates an operator graph for a stream-based computing application according to various embodiments.

FIG. 5 illustrates an exemplary operator graph 500 for a stream computing application beginning from one or more sources 135 through to one or more sinks 504, 506, according to some embodiments. This flow from source to sink may also be generally referred to herein as an execution path. Although FIG. 5 is abstracted to show connected processing elements PE1-PE10, the operator graph 500 may include data flows between stream operators 240 (FIG. 2) within the same or different processing elements. Typically, processing elements, such as processing element 235 (FIG. 2), receive tuples from the stream as well as output tuples into the stream (except for a sink—where the stream terminates, or a source—where the stream begins).

The example operator graph shown in FIG. 5 includes ten processing elements (labeled as PE1-PE10) running on the compute nodes 110A-110D. Tuples may be transmitted between the compute nodes 110A-110D via links L1-L4. While the links L1 and L2 are shown as distinct links, in one embodiment the connections represented by links L1 and L2 may be implemented with a single link used for portions of the execution path connecting PE2 to PE4 and PE3 to PE5. A processing element may include one or more stream operators fused together to form an independently running process with its own process ID (PID) and memory space. In cases where two (or more) processing elements are running independently, inter-process communication may occur using an inter-stream operator communication path (a "transport"), e.g., a network socket, a TCP/IP socket, a shared memory segment, a pipe, a named pipe, a message queue, a memory mapped file, a UNIX domain or inter-process communication socket, or any other similar operation. However, when stream operators are fused together, the fused stream operators may use communication techniques for passing tuples among themselves within the processing element that may be faster than inter-stream operator communication paths.

The operator graph 500 begins at a source 135 and ends at a sink 504, 506. Compute node 110A includes the processing elements PE1, PE2, and PE3. Source 135 flows into the processing element PE1, which in turn outputs tuples that are received by PE2 and PE3. For example, PE1 may split data attributes received in a tuple and pass some data attributes in a new tuple to PE2, while passing other data attributes in another new tuple to PE3. As a second example, PE1 may pass some received tuples to PE2 while passing other tuples to PE3. Data that flows to PE2 is processed by the stream operators contained in PE2, and the resulting tuples are then output via link L1 to PE4 on compute node 110B. Likewise, the tuples output by PE4 flow to operator sink PE6 504. Similarly, tuples flowing from PE3 to PE5 via link L2 also reach the operators in sink PE6 504. Thus, in addition to being a sink for this example operator graph, PE6 could be configured to perform a join operation, combining tuples received from PE4 and PE5. This example operator graph also shows tuples flowing from PE3 to PE7 on compute node 110C via link L3, which itself shows tuples flowing to PE8 and looping back to PE7. Tuples output from PE8 may flow to PE9 on compute node 110D via link L4, which in turn outputs tuples to be processed by operators in a sink processing element, for example PE10 506.

The tuple received by a particular processing element 235 (FIG. 2) is generally not considered to be the same tuple that is output downstream. Typically, the output tuple is changed in some way. An attribute or metadata may be added, deleted, or changed. However, it is not required that the output tuple be changed in some way. Generally, a particular tuple output by a processing element may not be considered to be the same tuple as a corresponding input tuple even if the input tuple is not changed by the processing element. However, to simplify the present description and the claims, an output tuple that has the same data attributes as a corresponding input tuple may be referred to herein as the same tuple.

Processing elements 235 (FIG. 2) may be configured to receive or output tuples in various formats, e.g., the processing elements or stream operators could exchange data marked up as XML documents. Furthermore, each stream operator 240 within a processing element 235 may be configured to carry out any form of data processing functions on received tuples, including, for example, writing to database tables or performing other database operations such as data joins, splits, reads, etc., as well as performing other data analytic functions or operations.

The stream manager 134 of FIG. 1 may be configured to monitor a stream computing application running on compute nodes, e.g., compute nodes 110A-110D, as well as to change the deployment of an operator graph, e.g., operator graph 132. The stream manager 134 may move processing elements from one compute node 110 to another, for example, to manage the processing loads of the compute nodes 110A-110D in the computing infrastructure 100. Further, stream manager 134 may control the stream computing application by inserting, removing, fusing, un-fusing, or otherwise modifying the processing elements and stream operators (or what tuples flow to the processing elements) running on the compute nodes 110A-110D. One example of a stream computing application is InfoSphere® Streams available from IBM® (note that InfoSphere® is a trademark of International Business Machines Corporation, registered in many jurisdictions worldwide).

Figure 6:
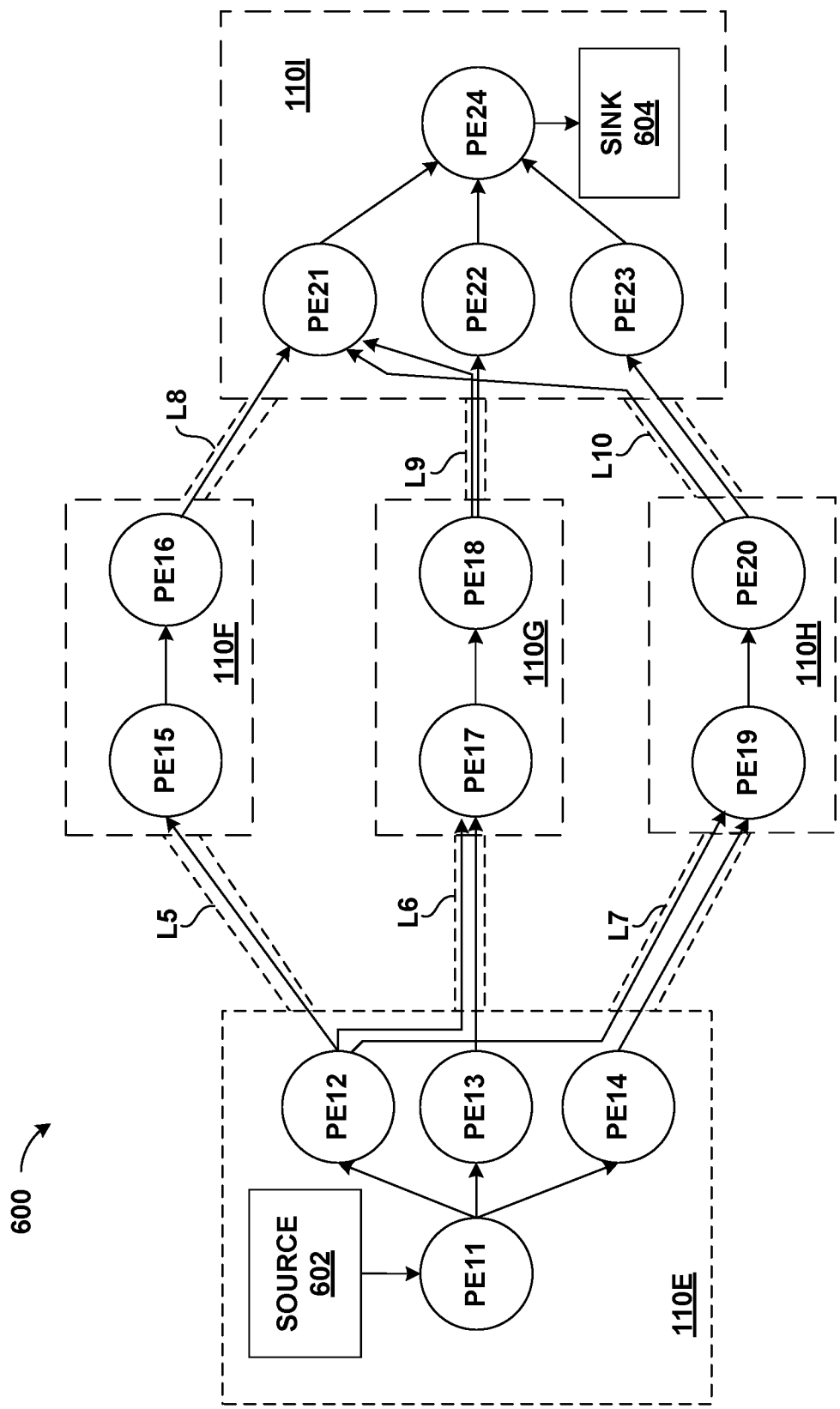
FIG. 6 illustrates an operator graph for a stream-based computing application according to an embodiment.

Because a processing element may be a collection of fused stream operators, it is equally correct to describe the operator graph as one or more execution paths between specific stream operators, which may include execution paths to different stream operators within the same processing element. FIGS. 5 and 6 illustrate execution paths between processing elements for the sake of clarity.

FIG. 6 illustrates an exemplary operator graph 600 for a stream computing application, beginning from one or more sources 602 and continuing through to one or more sinks 602. The operator graph 600 includes compute nodes 110E-110I. The compute node 110E includes the processing elements PE11, PE12, PE13, and PE14. The compute node 110F includes the processing elements PE15 and PE16. The compute node 110G includes the processing elements PE17 and PE18. The compute node 110H includes the processing elements PE19 and PE20. The compute node 110I includes the processing elements PE21, PE22, PE23, and PE34.

Processing elements on compute node 110E communicate tuples to processing elements on compute nodes 110F, 110G, and 110H, respectively, via links L5, L6 and L7. Processing elements on compute nodes 110F, 110G, and 110H communicate tuples to processing elements on compute node 110I, respectively, via links L8, L9 and L10.

Figure 7:
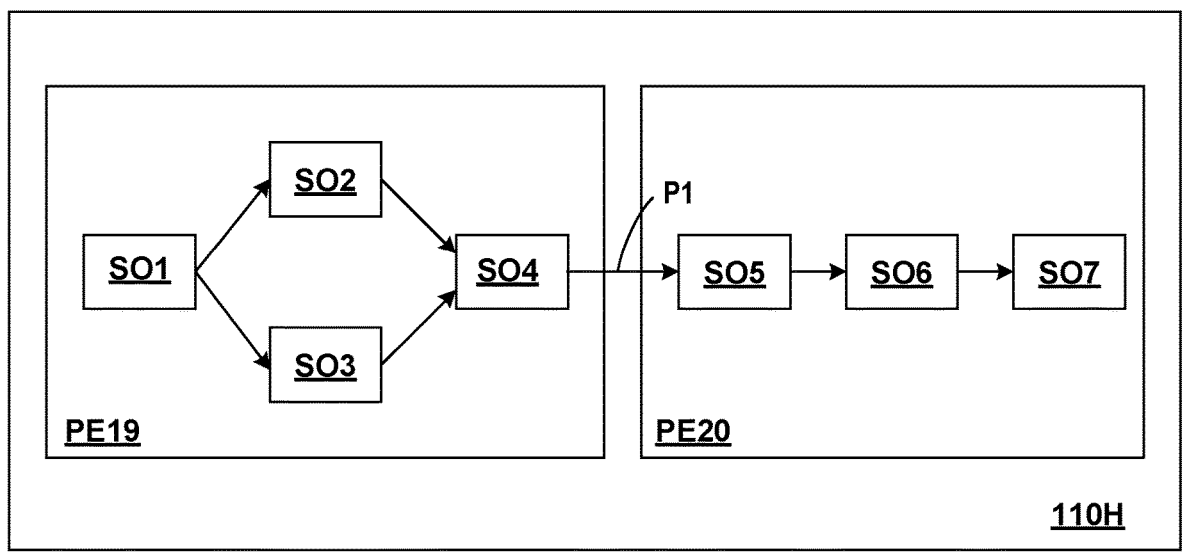
FIG. 7 illustrates an exemplary portion of an operator graph within a compute node, the portion including stream operators within processing elements.

FIG. 7 illustrates an exemplary portion of an operator graph within a compute node, the portion including stream operators within processing elements. In FIG. 7, the processing elements PE19 and PE20 on compute node 110H of FIG. 6 are shown in more detail. In this example, the processing element PE19 includes stream operators SO1, SO2, SO3, and SO4. In addition, the processing element PE20 includes stream operators SO5, SO6, and SO7. The stream operators SO4 and SO5 communicate via inter-stream operator communication path P1.

Simulations may be conducted to determine whether any of the links L5-L10 are bottlenecks. In addition, simulations may be conducted to determine whether any of the inter-stream operator communication paths, e.g., P1 in FIG. 7, are bottlenecks. Further, simulations may identify nodes with insufficient processing resources to handle the workload within required time periods. Simulations may be conducted to test a variety of different operator graph configurations and a variety of different scenarios.

In one embodiment, simulations may be conducted using different routing or sorting criteria. For example, PE11 may split a received stream according to a sorting criterion. For instance, PE11 may route tuples according to the alphabetical value of a particular attribute, such that tuples having a particular attribute that begins with: (a) a-h are routed to PE12; (b) i-o are routed to PE13; and (c) p-z are routed to PE14. A first simulation may be conducted with tuples being routed by PE11 according to this criterion. The routing criterion of PE11 may be modified and a second simulation conducted with the test stream being routed by PE11 according to the modified criterion. For example, the PE11 routing criteria may be modified so that tuples having a particular attribute that begins with: (a) a-e are routed to PE12; (b) f-m are routed to PE13; and (c) n-z are routed to PE14. Routing criteria may be modified at one or more processing elements.

In one embodiment, simulations are conducted using two or more different routing criteria. By conducting simulations using various routing criteria, a bottleneck that occurs when using particular routing criteria may be identified.

In one embodiment, simulations may be conducted using different workloads. Workloads may vary by data rate or by composition of the test data. For example, first, second, and third simulations may be conducted with tuples being supplied by or at source 602 at first, second, and third rates. As one example, the first and second rates may be relatively low and average rates, respectively, and the third rate may be a relatively high or peak rate. As another example of varying the workload, simulations may be conducted in which the composition of a particular attribute in the test data stream is varied. For example, tuples may be routed by PE11 based on the value of a particular attribute, such that tuples with the particular attribute that begins with: (a) a-h are routed to PE12; (b) i-o are routed to PE13; and (c) p-z are routed to PE14. In a first simulation, the composition of the test data stream is such that the numbers of input tuples in categories a-h, i-o, and p-z are substantially equal. In a second simulation, the composition of the test data stream is such that the numbers of tuples in the categories a-h, i-o, and p-z respectively correspond with 50%, 35%, and 15% of the input. By conducting simulations using different workloads, a bottleneck that occurs under a particular workload may be identified.

Simulations may be conducted with parts of an operator graph turned on or off (activating or deactivating). A link (or other inter-stream operator communication path), a compute node, a processing element, or stream operator may be activated or deactivated. Turning off or deactivating a compute node or a link may be used to simulate a hardware failure. Turning on or activating a compute node or a link may be used to simulate adding resources to an operator graph to determine whether the additional resources are sufficient to eliminate a bottleneck. For example, a first simulation of the operator graph 600 may be performed. After performing the first simulation using the entire operator graph 600, the compute node 110H may be turned off or, alternatively, the link L7 may be turned off and a second simulation performed. In this example, PE12 and PE14 recognize that PE19 on compute node 110H is unavailable to receive tuples. PE12 and PE14 may be configured to route the tuples that each would have sent to compute node 110H to another compute node. In this example, PE12 may be configured to route tuples that it would have sent to PE19 to PE17 or PE15 if compute node 110H is unavailable. Similarly, PE14 may be configured to route tuples that it would have sent to PE19 to PE17 or PE15 if compute node 110H is unavailable. In the second simulation when the compute node 110H is unavailable or inactive, one or more of links L5, L6, L8, or L9 may become bottlenecks. By conducting simulations with parts of the operator graph 600 turned off, a bottleneck that occurs when part of the operator graph is turned off may be identified.

As a second example, a first simulation of an operator graph may be performed. In this example, the operator graph that is simulated is a modified version of the operator graph 600 shown in FIG. 6. The modified operator graph in this example includes the compute nodes 110E, 110F, 110H, and 110I, but not compute node 110G. The first or baseline simulation of the modified operator graph may indicate that one or more of links L5, L7, L8, or L10 is a bottleneck. After performing the first simulation using the modified operator graph, the compute node 110G may be turned on (activated or otherwise made available to receive tuples) and a second simulation performed. In this example, after the compute node 110G is turned on, PE12 and PE13 recognize that PE17 on compute node 110G is available to receive tuples. PE12 and PE13 may be configured to begin routing tuples that would have been sent elsewhere to compute node 110G. The second simulation may show that a link identified as a bottleneck in the first simulation is no longer a bottleneck or that it remains a bottleneck. By conducting simulations with one or more additional compute nodes added to the modified operator graph, it may be determined whether a bottleneck that occurs in the modified operator graph will be eliminated be the additional compute nodes.

In one embodiment, a simulation directed to determining a performance metric with a part of an operator graph turned on or off may involve turning processing elements or stream operators within a compute node on or off. In a first example, a compute node may have a single core and processing elements passing tuples using a shared memory region. Simulations may be conducted with one or more of the processing elements turned on or off. In a second example, a compute node may have two or more cores and one or more processing elements running on each core. Tuples may be passed between processing elements running on different cores using a memory shared by the two or more cores, or by a bus used for communication among the cores. Simulations may be conducted with one or more of the processing elements running on the same or different cores turned on or off. In a third example, a compute node may have two or more chips, each chip having two or more cores. For example, a compute node may include eight chips, each chip having eight cores. One or more processing elements may be running on each of the 64 cores. In this example, the processing elements in this example may pass tuples using a single bus, shared memory, a crossbar switch, a banyan switch, an omega switch, or other switching fabric. Simulations may be conducted with one or more of the processing elements running on the same or different cores turned on or off.

In one embodiment, simulations may be conducted of stream operator or processing element behavior that affects network performance. This type of behavior may include an operator or processing element that is unable to keep up with workload demands as well as an operator or processing element that initiates network traffic in addition to traffic associated with transmitting tuples. In one embodiment, simulations may be conducted in which a stream operator or processing element uses various sorting criteria. For example, PE12 may employ first and second sorting criteria in two simulations. In a first simulation, PE12 may sort tuples so that 20% of the tuples it outputs are sent to PE15. In a second simulation, PE12 may sort tuples so that 50% of the tuples it outputs are sent to PE15. The second simulation increases processing requirements on PE15 and node 110F. This increase in required processing may in turn cause tuples that PE15 receives from PE12 to form an excessive queue, e.g., a queue that exceeds some threshold for a predetermined period of time, at an input port to PE15. Alternatively, this increase in required processing may in turn cause PE12 to shed, i.e., discard without processing, some of the tuples that it receives from PE15. While an excessive queue at PE15 in this example is not a result of insufficient bandwidth on link L5, the excessive queue may affect the overall performance of the operator graph 600 in the same manner as a bottleneck. Similarly, load shedding at PE15 may affect overall performance of the application. By conducting simulations in which a stream operator or processing element uses various sorting criteria, it may be determined whether the use of particular sorting criteria causes a stream operator workload to increase beyond the operator's capacity to process tuples in a timely manner.

In one alternative embodiment, simulations may be conducted in which a stream operator or processing element performs an operation that may affect the network. For example, a simulation may be performed in which PE18 is configured to open a network socket and initiate a network communication on link L9 in response to a condition. This network communication by PE18 may be with an entity that is not part of the operator graph 600. Alternatively, it may be a network communication with a compute node that is part of the operator graph 600, but the communication is unrelated to the stream-based computing application. In either case, the communication is a non-tuple or an "extra stream-based computing application communication." In this example, this network communication uses part of the bandwidth available on link L9 that would otherwise be available for transmitting tuples. Depending on the frequency and size of these extra-stream communications, a bottleneck may occur on link L9. In various embodiments, simulations are performed in which a processing element or stream operator opens a network socket and initiates a network communication. The simulations may include varying the condition that triggers the communication or the size of the network communication.

Figure 8:
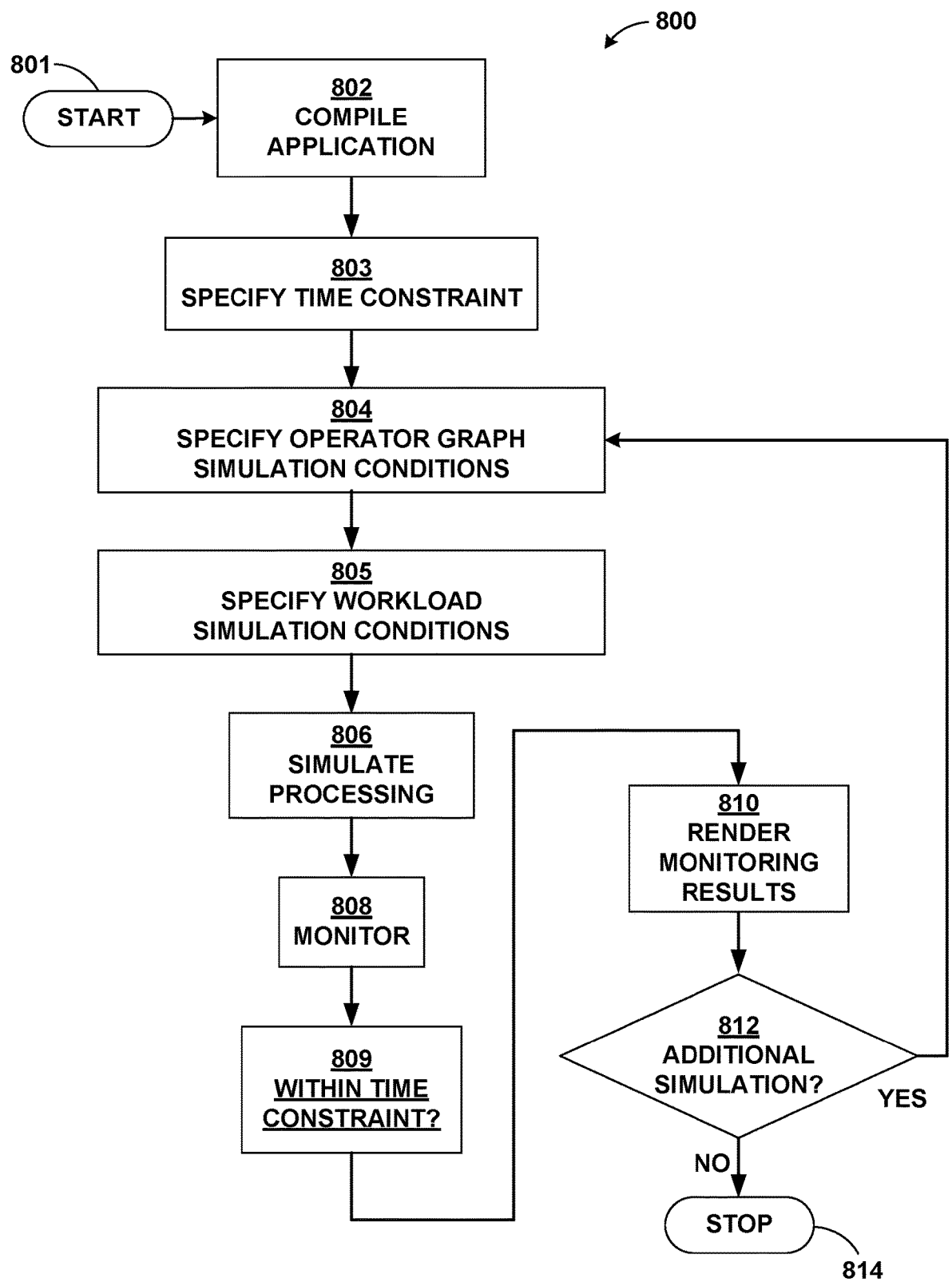
FIG. 8 illustrates a flow diagram of a method for simulating a stream-based computing application according to an embodiment.

FIG. 8 illustrates an exemplary flowchart of a method 800 for simulating a stream-based computing application according to various embodiments. While the figure depicts particular operations as being performed sequentially, it should be understood that various operations may be performed simultaneously or in other sequences. The method 800 may begin with operation 801, from which it proceeds to operation 802. In operation 802, a compiler, e.g., compiler 136, may compile one or more processing elements, e.g., processing element 235. The compiler 136 may output a configuration for the streaming application, which may include assigning one or more processing elements 235 to one or more compute nodes, e.g., compute node 110. The output of the compiler 136 may include an operator graph 132.

In operation 803, a processing time constraint may be specified. Generally, stream-based applications must process data in real time. In operation 803, a user may specify a particular minimum amount of time in which tuples must be processed. For example, a user may specify that each tuple in a data stream must be processed in no more than one millisecond or no more than 100 microseconds. The time constraint will vary depending on the application. The processing time constraint may be expressed in terms of path or operator graph travel times, which are further described below.

In operation 804, conditions for a particular simulation may be specified. The conditions that may be specified in operation 804 are conditions that relate to the operation of particular elements of the operator graph. Operation 804 may include specifying: (1) the manner in which stream operators and processing elements simulate processing; (2) whether particular parts (stream operators, processing elements, compute nodes, and links) of the operator graph are on or off during simulated processing, and (3) other pertinent parameters that relate to functional aspects of an operator graph. The manner in which stream operators and processing elements simulate processing may include: (a) whether a stream operator or processing element performs operations that may affect a network, e.g., opening a network socket; (b) conditions for sorting or routing tuples at a stream operator or processing element; (c) the size and number of tuples output by a stream operator or processing element in response to receiving an input tuple; (d) how a stream operator or processing element simulates processing, e.g., processing times, retransmission timer values; (e) conditions under which a stream operator or processing element sheds tuples; and (f) whether and how a stream operator or processing element groups tuples for transmission.

Specifying a simulation condition for a particular simulation may specify a particular operator graph configuration. For example, a simulation condition that part of an operator graph is to be off during simulated processing specifies a particular operator graph configuration. As another example, a simulation condition that a stream operator is to sort or route tuples according to a specified criteria at during simulated processing specifies a particular operator graph configuration.

Operation 804 may include specifying operator metadata. Operator metadata configures stream operators. By specifying operator metadata, the manner in which stream operators and processing elements simulate processing may be specified. In various embodiments, operator metadata may be specified to configure a stream operator to not process the tuples it receives, but instead to simulate processing. Operation 804 may include setting parameters or metadata that specify how processing is to be simulated. For example, a stream operator may be configured to output a particular number of tuples for every tuple received. As another example, a stream operator may be configured to output one or more tuples following receiving an input tuple after a particular time delay. For example, a processing element or stream operator may receive a tuple, hold the tuple for 5 ms, and then transmit a corresponding tuple to another stream operator without performing any processing. A stream operator may be configured to set a particular attribute value of a received tuple to a default value. A stream operator that sorts tuples, routing input tuples to one of two or more other stream operators according to a condition, may have the sorting condition specified in operation 804. A stream operator that transmits tuples on link may be configured to group and send two or more tuples as a group in a single transmission rather than transmitting each tuple individually. A stream operator that includes a timer, such as a retransmission timer, may have its time limit set in operation 804. Operation 804 may include specifying metadata for simulating any type of operation a stream operator may perform. In addition, operation 804 may include specifying that a stream operator perform only limited processing of tuples. In various embodiments, the application verifier 340, the compiler 136, or any other suitable component may set stream operator parameters or metadata.

Operation 804 may additionally include specifying operator metadata that configures a stream operator or processing element to behave in a way that affects network performance, i.e. to engage in extra stream-based computing application communications. In particular, a stream operator that opens a network socket and initiates a network transmission or reception or both following the receipt of a tuple or according to another condition may have the condition specified in operation 804.

In operation 805, additional conditions for a particular simulation may be specified. The conditions that may be specified in operation 805 are conditions that relate to workload placed on an operator graph. Operation 804 may include specifying: (a) the rate at which test tuples are input to the stream-based application; (b) the attributes of the test tuples, e.g., attributes that require different amounts of processing resources; (c) the size of test tuples; (d) the level of network traffic on a unrelated to a stream-based computing application; (e) the amount of processing resources on various compute nodes consumed by applications other than a stream-based computing application; and (f) other pertinent parameters that relate to the workload placed on an operator graph.

In operation 806, a stream-based computing application may be simulated. The operation 806 may include the stream manager 134, source 135, source 602, or other suitable source inputting a stream of test tuples into the operator graph. Alternatively, test data may be input at any point in the operator graph. The test data may be data, e.g., a stream of tuples that facilitates simulation of a stream-based computing application in a way that isolates network effects. In one embodiment, the test data may include a tuple with attribute values that cause the processing element or stream operator to omit processing of the tuple. For example, a particular attribute of a tuple may be all nines or all zeros. In another embodiment, the test data may also contain a runtime flag to indicate that the processing element or stream operator may omit processing of the tuple. In yet another embodiment, metadata for the stream operators are specified so that the operators are configured to treat all tuples received as test data without regard to data value. In general, test tuples may be sized to simulate actual or predicted network or bus traffic. For example, if tuples transmitted on a particular link are expected to be 64 bytes, test tuples transmitted on this link during simulation may be 64 bytes.

In operation 806, a test tuple may be "passed through" a stream operator or processing element, meaning that the test tuple is not processed or only limited processing is performed on the test tuple. As mentioned, operator metadata may be specified in operation 804 to configure a stream operator to not process the tuples it receives or to configure an operator to perform limited processing.

In operation 806, stream operators and processing elements may simulate the processing of tuples. For example, in FIG. 5, PE1 may transmit tuples to PE2 and PE3. If the tuples received by PE1 are 128 bits but PE2 expects PE1 to output tuples that are 256 bits, then PE1 may add 128 bits to the test tuples it outputs to simulate processing prior to transmitting to PE2. In other embodiments, bits may be subtracted to simulate processing. In some embodiments, the stream manager 134 may simulate the processing of a test tuple, while in other embodiments a stream operator or processing element may simulate the processing of a test tuple.

In operation 808, a stream-based computing application may be monitored. Operation 808 may be performed while test tuples are flowing through an operator graph, i.e., concurrently with operation 806. In operation 808, the stream manager 134 or application verifier 340 may monitor the inter-stream operator communication paths for bottlenecks or any other metric that affects network or application performance. Stream operators or processing elements may report various metrics to the stream manager 134 or application verifier 340. In addition, various metrics may be reported by the stream manager 134, application verifier 340, or by an operating system. Metrics reported by the stream manager 134 or application verifier 340 may include the number of tuples queued at input or output ports of a particular processing element or stream operator, processing element or operator throughput, or link health and behavior. Metrics reported by the operating system may include, but are not limited to, a network load, link utilization, hop count, path speed, packet loss, link availability, latency, path reliability, path bandwidth, or throughput.

Processing elements or stream operators may periodically send monitoring data to the stream manager 134 or application verifier 340. For example, a test tuple may include an identifier so that a first processing element may notify the stream manager 134 that a particular test tuple was output at a first time and a second processing element may notify the stream manager 134 or application verifier 340 that the test tuple was received at a second time. This monitoring data from the first and second processing elements may be used by the stream manager 134 to determine how long the particular test tuple took to travel from the first processing element to the second processing element, i.e., path travel time. In an alternative embodiment, a time stamp may be added to a particular test tuple at a first processing element and a second processing element that receives the tuple may inspect the time stamp to determine travel time. In this alternative, the stream manager 134 or application verifier 340 may periodically poll the second processing elements to determine path travel time. In these embodiments, the first and second processing elements or stream operators may be directly coupled by an inter-stream operator communication path or link, indirectly coupled via two or more inter-stream operator communication paths or links or via one or more processing elements, or via both plural inter-stream operator communication paths or links and processing elements. In one embodiment, path travel time may be an average. For example, the times taken for one million tuples to travel a particular path may be averaged to produce an average path travel time. In addition, the path travel times for all paths in an operator graph may be combined to generate an operator graph travel time.

Operation 808 may include determining where a bottleneck or other congestion occurs in the operator graph 500. This determination may be performed by the stream manager 134 or application verifier 340. In particular, the operation 808 may include inspecting stream operators or processing elements that have either an input or output port coupled with an inter-stream operator communication path, such as a link, e.g., PE23 and PE20 with respect to link L10. In addition, it may include inspecting stream operators or processing elements that do not have an input or output port coupled with a link, e.g., an input port of PE16. Further, it may include inspecting stream operators within a processing element, e.g., stream operator SO6 within processing element PE20 (FIG. 7). An inter-stream operator communication path may be identified as a bottleneck if the stream operator or processing element has an input or output queue of tuples that is outside a threshold, e.g., greater or less than a threshold. In one embodiment, the inter-stream operator communication path may be identified as a bottleneck if the queue of tuples exceeds the threshold for a particular period of time, e.g. 20 ms. In one alternative, the inter-stream operator communication path may be identified as a bottleneck if the queue of tuples exceeds the threshold a particular number of times during a specified time period, e.g. five times in a 500 ms period. A stream operator or processing element may be configured to shed or discard tuples if it is unable to process received tuples in a timely manner. In one embodiment, an inter-stream operator communication path, such as a link, feeding tuples to a stream operator or processing element may be identified as a bottleneck if the operator or processing element is sheds or discards tuples. The link may be identified as a bottleneck if the number of tuples shed exceeds a threshold or if the operator or processing element sheds tuples for more than a time period exceeding a threshold.

A stream operator or processing element may be configured to receive first and second tuples, respectively, via first and second links and output a third tuple after receipt of both tuples. In one embodiment, an inter-stream operator communication path may be identified as a bottleneck if the time period between receipt of the first tuple and the output of the third tuple is outside of a threshold. For example, PE24 may be configured to combine first, second, and third tuples respectively received from PE21, PE22, and PE23. The first tuple may arrive from PE21 at time zero, the second tuple may arrive from PE22 3 ms later, but the third tuple may not arrive from PE23 until 100 ms after time zero. Accordingly, PE24 is not able to output of a fourth tuple until more than 100 ms after time zero. A threshold may be set at 50 ms. The elapsed time between time zero and the output of the fourth tuple will be outside the threshold, indicating that link L7 or link L10 may be a bottleneck.

In operation 809, an operator graph travel time, an average operator graph travel time, or other similar metric determined in a monitoring operation may be compared with a processing time constraint. If operator graph travel time is outside of the processing time constraint, e.g., travel time is greater than the time constraint, it may be inferred that the operator graph is unable to handle the specified workload in the time allowed. On the other hand, if operator graph travel time is within the processing time constraint, e.g., travel time is less than the time constraint, it may be inferred that the operator graph is capable of handling the specified workload in the time allowed.

In operation 810, results of monitoring a simulation of a stream-based computing application may be generated. The monitoring results that are generated in operation 810 may be rendered for viewing by a user in any known manner. The monitoring results that are generated in operation 810 may be stored in a memory. Monitoring results may include an indication of whether the operator graph is capable of handling the specified workload in the time allowed. Monitoring results may include inter-stream operator communication paths identified as bottlenecks. The particular simulation conditions specified in operation 804 may be rendered together with the monitoring results for the simulation. Multiple simulations may be performed and the monitoring results generated in operation 810 may include combining the results of the multiple simulations.

In operation 812, it may be determined whether an additional simulation of a stream-based computing application is to be performed. Typically, multiple additional simulations are performed, each simulation being performed under a different set of conditions. The various conditions may be simulated in a systematic manner. For example, one or more simulations may be performed in which the manner in which stream operators and processing elements simulate processing is varied. One or more simulations may be performed in which the rate at which test tuples are input to the stream-based application is varied. One or more simulations may be performed in which the attributes of the test tuples are varied. One or more simulations may be performed in which particular parts of the operator graph are either on or off during simulated processing. One or more simulations may be performed in which operators or processing elements perform operations that may affect a network. One or more simulations may be performed in which other pertinent parameters are varied. If additional simulations are to be performed, the method 800 moves to operation 804, where a set of conditions for the next simulation are specified. Otherwise, the method stops at 814.

Figure 9:
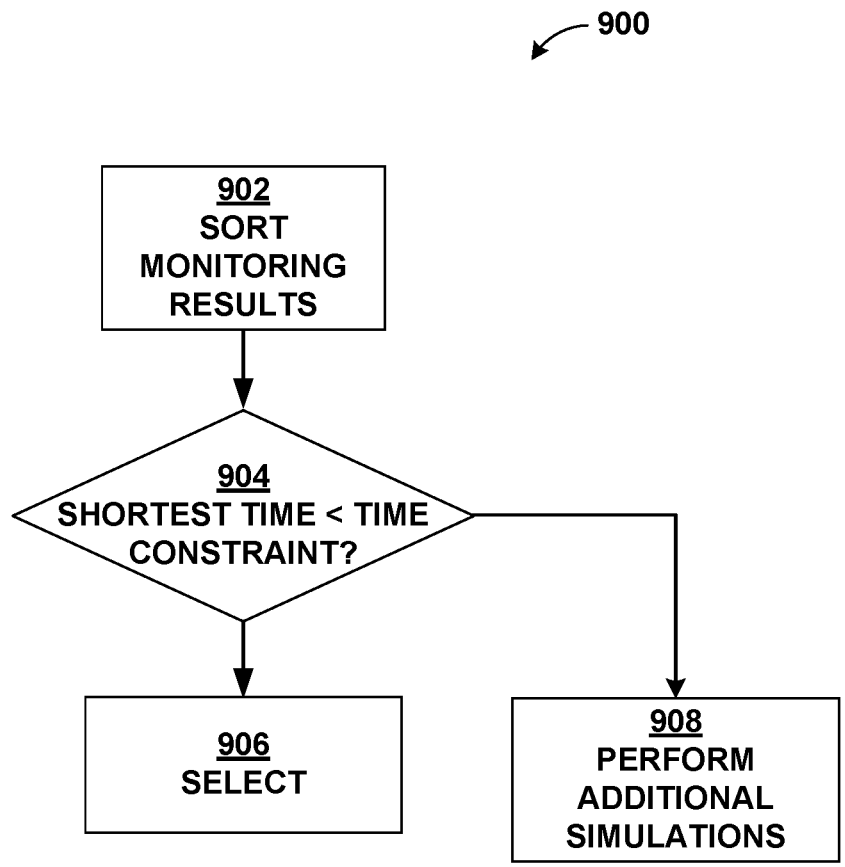
FIG. 9 illustrates an exemplary flowchart of a method for selecting an operator graph configuration for a stream-based computing application according to various embodiments.

FIG. 9 illustrates an exemplary flowchart of one method 900 for selecting an operator graph configuration for a stream-based computing application according to various embodiments. In operation 902, the monitoring results for one or more simulations may be sorted based on a first performance metric. In one embodiment, each simulation is performed using different simulation conditions and the monitoring results include an indication of processing time, such as a path or graph travel time. In one embodiment, the simulations may be sorted based on a first performance metric, such as processing time. In alternative embodiments, the simulations may be sorted according to another metric, such as network resources or the number or type compute nodes deployed in an operator graph. Sorting may identify a simulation having a first rank, i.e., the performance metric on which the sort was based is higher or lower than other simulations. In operation 904, a performance metric for the simulation with the first rank may be compared with a processing constraint, i.e., a simulation having the shortest processing time, using the fewest resources, and the like. In one embodiment, the processing constraint may be processing time constraint. For example, the processing time for a first ranked simulation (one having a processing time shorter than processing times of other simulations) may be compared with a processing time constraint. If the performance metric for the simulated processing having the first rank is within a processing constraint, an operator graph configuration associated with the simulation may be selected. For instance, if the processing time for the first ranked simulation is less than the processing time constraint, the operator graph configuration associated with the simulation may be selected for use in a production environment (operation 906). On the other hand, if the performance metric for the first ranked simulated processing is outside of the processing constraint, the operator graph configuration associated with the simulation is not selected for use in a production environment. That is, if the processing time for the first ranked simulation is less than the processing time constraint, it may be inferred that none of the simulations satisfies the processing time constraint and additional simulations may be performed in operation 908. The additional simulations may be performed in operation 908 in order to determine an operator graph configuration that will meet the processing time constraint.

In the foregoing, embodiments were described in which stream operators or processing elements of a stream-based application do not process tuples, but rather simulate the processing of tuples in order to identify the network effects on the streaming application. It should be understood, however, that in other embodiments the stream operators or processing elements may process tuples during a simulation to identify network effects.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination thereof. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination thereof. In the context of this disclosure, a computer readable storage medium may be any tangible medium that can contain, or store, a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination thereof.

Computer program code for carrying out operations for aspects of the present disclosure may be written in any combination of one or more programming languages, including: (a) an object oriented programming language such as Java, Smalltalk, C++, or the like; (b) conventional procedural programming languages, such as the "C" programming language or similar programming languages; and (c) a streams programming language, such as IBM Streams Processing Language (SPL). The program code may execute as specifically described herein. In addition, the program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure have been described with reference to flowchart illustrations, block diagrams, or both, of methods, apparatuses (systems), and computer program products according to embodiments of this disclosure. It will be understood that each block of the flowchart illustrations or block diagrams, and combinations of blocks in the flowchart illustrations or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions or acts specified in the flowchart or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function or act specified in the flowchart or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions or acts specified in the flowchart or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

Although embodiments are described within the context of a stream computing application, this is not the only context relevant to the present disclosure. Instead, such a description is without limitation and is for illustrative purposes only. Additional embodiments may be configured to operate with any computer system or application capable of performing the functions described herein. For example, embodiments may be configured to operate in a clustered environment with a standard database processing application. A multi-nodal environment may operate in a manner that effectively processes a stream of tuples. For example, some embodiments may include a large database system, and a query of the database system may return results in a manner similar to a stream of data.

While the foregoing is directed to exemplary embodiments, other and further embodiments of the disclosure may be devised without departing from the basic scope thereof, and the scope thereof is determined by the claims that follow.

What is claimed is:

1. A computer program product for selecting an operator graph configuration for a stream-based computing application, the computer program product comprising a non-transitory computer readable storage medium having program code embodied therewith, the program code comprising computer readable program code configured to:
  perform a first simulated processing of the stream-based computing application using a first simulation condition, the first simulation condition specifying a first operator graph configuration;
  perform a second simulated processing of the stream-based computing application using a second simulation condition, the second simulation condition specifying a second operator graph configuration, the second simulation condition being distinct from the first simulation condition;
  each simulated processing including inputting a stream of test tuples to the stream-based computing application, the stream-based computing application operating on one or more compute nodes, each compute node having one or more computer processors and a memory to store one or more processing elements, each processing element having one or more stream operators;
  monitor each simulated processing to determine one or more performance metrics;

sort the first and second simulated processings based on a first performance metric to identify a simulated processing having a first rank;

select an operator graph configuration associated with the simulated processing having the first rank if the first performance metric for the simulated processing having the first rank is within a processing constraint; and use the selected operator graph configuration in a live production environment.

2. A stream-based computing system, comprising:

one or more compute nodes, each compute node having one or more computer processors and a memory to store one or more processing elements, each processing element having one or more stream operators, the compute nodes being configured to:

perform a first simulated processing of the stream-based computing application using a first simulation condition, the first simulation condition specifying a first operator graph configuration;

perform a second simulated processing of the stream-based computing application using a second simulation condition, the second simulation condition specifying a second operator graph configuration, the second simulation condition being distinct from the first simulation condition; and a management system operating on a compute node, the compute node having one or more computer processors and a memory to store an application verifier, the application verifier being configured to:

monitor each simulated processing to determine one or more performance metrics;

sort the first and second simulated processings based on a first performance metric to identify a simulated processing having a first rank;

select an operator graph configuration associated with the simulated processing having the first rank if the first performance metric for the simulated processing having the first rank is within a processing constraint; and use the selected operator graph in a live production environment.

3. The stream-based computing system of claim 2, wherein, if the first performance metric for the simulated processing having the first rank is outside of the processing constraint, the compute nodes are further configured to perform a third simulated processing of the stream-based computing application using a third simulation condition, the third simulation condition specifying a third operator graph configuration and being distinct from the first and second simulation conditions.

4. The stream-based computing system of claim 2, wherein the one or more performance metrics includes a processing time and the processing constraint is a processing time constraint, wherein the first and second simulated processings each simulate the processing of tuples rather than actually process tuples in the stream-based computing application.

5. The stream-based computing system of claim 2, wherein the first simulation condition includes deactivating one of the compute nodes.

6. The stream-based computing system of claim 2, wherein the first simulation condition includes configuring a stream operator to initiate an extra stream-based computing application communication.

7. The stream-based computing system of claim 2, wherein the first simulation condition includes configuring a stream operator to group two or more tuples for transmission.

* * * * *